(12) United States Patent
Boerner

(10) Patent No.: US 7,768,198 B2
(45) Date of Patent: Aug. 3, 2010

(54) ORGANIC ELECTROLUMINESCENT LIGHT SOURCE

(75) Inventor: Herbert Friedrich Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 483 days.

(21) Appl. No.: 11/720,636

(22) PCT Filed: Dec. 1, 2005

(86) PCT No.: PCT/IB2005/053998

§ 371 (c)(1),
(2), (4) Date: Jun. 1, 2007

(87) PCT Pub. No.: WO2006/061744

PCT Pub. Date: Jun. 15, 2006

(65) Prior Publication Data

US 2009/0230841 A1   Sep. 17, 2009

(30) Foreign Application Priority Data

Dec. 6, 2004   (EP) .................................. 04106335

(51) Int. Cl.
*H05B 33/02* (2006.01)
*H01L 51/00* (2006.01)

(52) U.S. Cl. ..................... 313/512; 313/506; 313/509

(58) Field of Classification Search ................. 313/512, 313/506, 509
See application file for complete search history.

(56) References Cited

U.S. PATENT DOCUMENTS

| | | | | |
|---|---|---|---|---|
| 5,962,962 A * | 10/1999 | Fujita et al. | ................. | 313/412 |
| 6,066,861 A | 5/2000 | Hohn et al. | | |
| 6,515,417 B1 | 2/2003 | Duggal et al. | | |
| 2004/0061107 A1 | 4/2004 | Duggal | | |
| 2004/0119402 A1 | 6/2004 | Shiang et al. | | |

FOREIGN PATENT DOCUMENTS

| | | | |
|---|---|---|---|
| EP | 1406474 A1 | | 4/2004 |
| EP | 1603367 A1 | * | 12/2005 |
| WO | WO 2004089042 A1 | * | 10/2004 |
| WO | WO 2005045488 A1 | * | 5/2005 |

* cited by examiner

*Primary Examiner*—Nimeshkumar D. Patel
*Assistant Examiner*—Anthony T Perry

(57) ABSTRACT

An electroluminescent light source having a substrate (1), a layer structure applied on the substrate (1) for emitting light (10) at least on the other side from the substrate, having at least one electrode as an anode (3), at least one electrode as a cathode (4) and at least one organic electroluminescent layer (2) lying between them, the electrode (4) on the other side from the substrate being at least partially transparent, and an at least partially transparent encapsulation device (5) for forming a closed volume (6) around the layer structure, which is filled with a dielectric liquid (11) that is substantially chemically inert with respect to the layer structure and which contains particles (12), in particular of a non-absorbent material, for scattering light, the density of which is selected so that the particles (12) are in the suspended state in the dielectric liquid (11).

18 Claims, 2 Drawing Sheets

ORGANIC ELECTROLUMINESCENT LIGHT SOURCE

Figure 1:
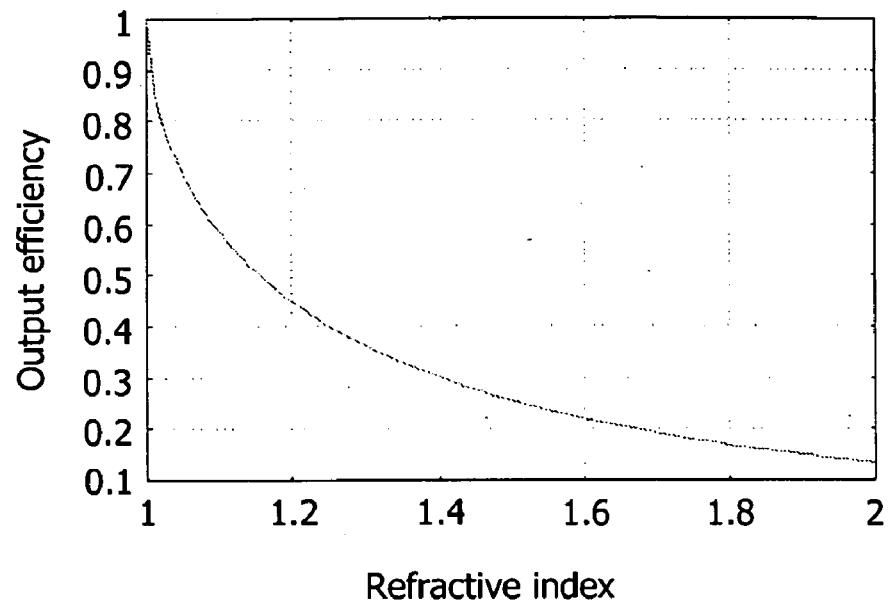

The invention relates to encapsulated organic electroluminescent light sources having improved light output by means of light scattering.

Electroluminescent light sources (EL light sources) comprising a multiplicity of thin layers (layer structure) having an organic electroluminescent layer (EL layer) for emitting light are known. Since the organic layers in particular react sensitively to ambient conditions, for example humidity, the EL light source is mechanically encapsulated and the intermediate space between the layer structure and the encapsulation device is filled with chemically inert substances. Distinction is generally made between bottom emitters (emission through the transparent substrate) and top emitters (emission through the transparent encapsulation device). In top emitters, the substrate may also be non-transparent. One problem with electroluminescent light sources is the low luminous efficiency, of the order of 20-30%, of the light generated in the EL layer due to losses during output of the light from the EL light source.

Document EP 1406474 describes an electroluminescent light source in which the light output is improved by an additional scattering layer which is arranged between a substrate and a transparent electrode, and which is applied on the layer structure of the EL light source by means of a thin film process. The scattering layer consists of a matrix material, in which particles having diameters comparable to the wavelength of the light to be scattered are embedded as scattering centers. For good light input from the layer structure of the EL light source into the scattering layer, the matrix material should have a refractive index of at least 1.55 (corresponding to at least 90% of the refractive index of a typical organic EL layer, i.e. 1.7). The scattering layer is applied on the layer structure of the EL light source by coating techniques, for example spin coating, or printing techniques. Additional layer processes are elaborate and therefore increase the production costs. Furthermore, such layers must not perturb the properties of the layer structure applied on them by their layer properties, for example roughness and adhesion properties. In top emitters, the problem of the output losses at the transition from an optically thicker medium into an optically thinner medium actually occurs two times (layer structure→interior of encapsulation and encapsulation→exterior), which would entail additionally increased production outlay for a corresponding plurality of scattering layers.

It is therefore an object of this invention to provide an inexpensive device for reducing the output losses of a top emitting electroluminescent light source without additional layer processes.

This object is achieved by an electroluminescent light source having a substrate, a layer structure applied on the substrate for emitting light at least on the other side from the substrate, having at least one electrode as an anode, at least one electrode as a cathode and at least one organic electroluminescent layer lying between them, the electrode on the other side from the substrate being at least partially transparent, and an at least partially transparent encapsulation device for forming a closed volume around the layer structure, which is filled with a dielectric liquid that is substantially chemically inert with respect to the layer structure and which contains particles, in particular of a non-absorbent material, for scattering light, the density of which is selected so that the particles are in the suspended state in the dielectric liquid. A part of the light which could not be output from the encapsulation device into the surroundings of the EL light source, owing to total reflection, is deviated in the dielectric liquid in the direction of the encapsulation device by means of light scattering at the particles, and at least partially output. The dielectric liquid with scattering particles therefore represents an inexpensive improvement of the light output from the electroluminescent light source, since no additional layers for scattering light need to be applied on the electroluminescent light source and the light scattering particles can easily be added to the dielectric liquid before the electroluminescent light source is filled with it. Particles of non-absorbent material furthermore prevent light losses by absorption at the particles.

It is preferable for the particles to consist of at least one first material having a density greater than the density of the dielectric liquid and at least one second material having a density less than the density of the dielectric liquid. It is therefore possible to use materials, for example having particularly advantageous scattering properties, which owing to their low or high density cannot on their own assume a suspended state in the dielectric liquid. By the second material having a density selected according to the density of the first material, the density of the overall particle is adapted so that the particle is in a suspended state in the dielectric liquid.

For production of the particles, it is particularly preferable for the first or second material to be an organic material. It is even more preferable for the first material of the particles to be enclosed by the second material of the particles for scattering the light. The light scattering properties of the particle can therefore be adjusted independently of the density of the particle.

For scattering the light, it is preferable for the particles to have a diameter of between 10 nm and 2000 nm and/or a volume proportion of between 5% and 60% in the dielectric liquid and/or for the magnitude of the difference between the refractive index of the dielectric liquid and the refractive index of the particles to be greater than 0.1.

For scattering the light, it is particularly preferable for the refractive index of the particles to be greater than 1.5, preferably greater than 2.0.

It is even more-preferable for the diameter, the refractive index and the volume proportion of the particles in the dielectric liquid to be selected so that the refractive index of the dielectric liquid with particles is greater than 1.4, and preferably equal to the refractive index of the layer structure of the EL light source. Output losses from the EL layer structure into the dielectric liquid can thereby be avoided, and the output losses from the encapsulation device can be greatly reduced by light scattering at the particles in the dielectric liquid preferentially in the direction of the surface of the encapsulation device.

These and other aspects of the invention are apparent from and will be elucidated with reference to the embodiments described hereinafter.

Figure 2:
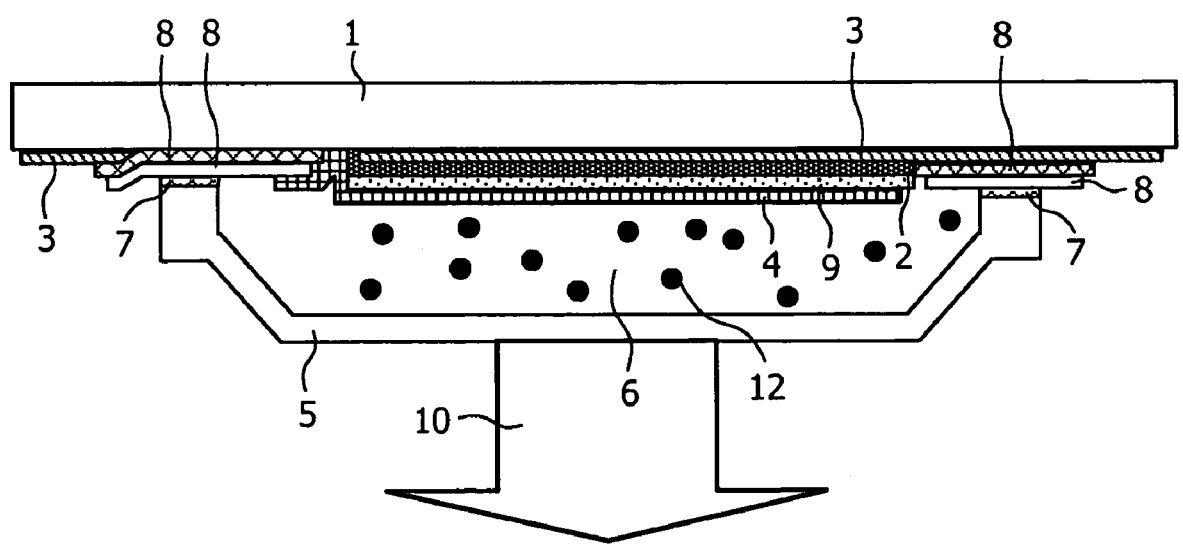
Figure 3:
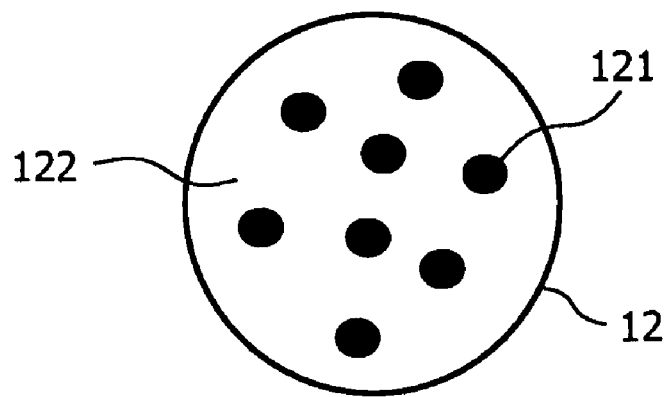
Figure 4:
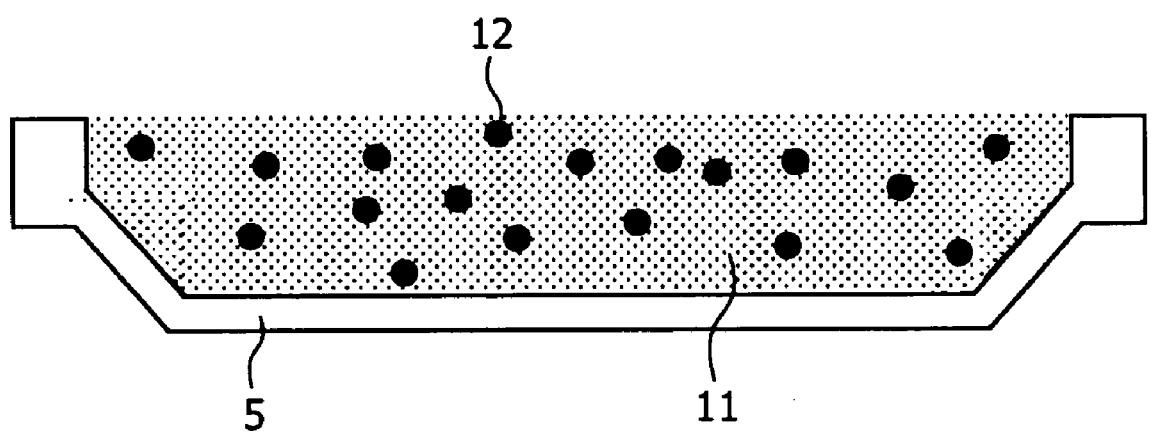

In the drawings:

FIG. 1 shows the efficiency of the light output at the transition from an optically denser material to air, FIG. 2 shows a top emitting electroluminescent light source according to the invention, FIG. 3 shows a structure of particles according to the invention comprising a plurality of materials, and FIG. 4 shows an encapsulation device filled with a dielectric liquid having light scattering particles according to the invention.

FIG. 1 shows the output efficiency of light from an optically denser medium (refractive index>1) to air (n=1). Conventional transparent substrates and/or encapsulation devices, for example of PMMA or glass, have refractive indices of between 1.5 and 2.0. As can be seen from the curve, the corresponding output efficiency without additional measures to improve the output efficiency is ≦26% when these materials are used. In order to increase the output efficiency, additional light scattering layers on the substrate are known, but they entail an additional layer process during production of the EL light source.

FIG. 2 shows the side view of an electroluminescent light source according to the invention as a so-called top emitter, i.e. the emission of light 10 takes place through an at least partially transparent encapsulation device 5. Because of this emission direction, moreover, the substrate 1 cannot be transparent. The layer structure of the electroluminescent light source, which is applied on the substrate 1, contains a thin organic layer stack with an electroluminescent layer 2 (for example doped tris-(8-hydroxyquinolinato)aluminum) with a typical thickness in the range of 100 nm, which is arranged between two electrodes 3 and 4 (for example an anode 3 and a cathode 4 as shown in FIG. 1). The electrode lying in the emission direction in top emitters, here the cathode 4, is at least partially transparent. Indium tin oxide (ITO) is conventionally used as a transparent conductive material. A metal layer, for example aluminum, having a thickness of the order of 100 nm is used as a conductive material for the conventionally non-transparent anode 3. Nevertheless, arrangements in which the light is emitted simultaneously in the top and bottom directions are also possible. In such an arrangement, the anode 3 and the substrate 1 are both made of at least partially transparent materials. Between the organic luminescent layer 2 and the anode 3, a further organic layer is usually arranged as a hole conductive layer, typically alpha NPD (N,N'-di(naphthalen-2-yl)-N,N'-diphenyl-benzidine) having a thickness of about 50 nm. Between the cathode 4 and the organic luminescent layer 2, there is conventionally a thin electron injection layer 9 of a material having a low work function, for example lithium, cesium or barium, which is important for good injection of electrons into the luminescent layer. In principle, the layer structure may also be applied on the substrate in the reverse order. In other embodiments of an electroluminescent light source, yet further layers may be added to the layer structure, for example micro-cavity layers to improve the light output. Since the layer structure reacts very sensitively to ambient conditions, especially humidity, electroluminescent arrangements are provided with an encapsulation device. The at least partially transparent encapsulation device 5 in top emitters is connected to the layer structure, for example by means of adhesive bonds 7, so that a closed volume 6 is produced between the layer structure and the encapsulation device 5. Conventional distances between the encapsulation device 5 and the layer structure are in the range of a few 10 μm and a few 100 μm. The encapsulation device 5 shown here represents only one possible embodiment. In other embodiments, the encapsulation device may be configured differently. For example, a getter material may additionally be arranged inside the volume 6 in order to reduce the humidity/water content. For electrically driving the layer structure located inside the encapsulation, conductive tracks 8 and 3 are fed out from the volume 6. In order to protect the layer structure, the volume 6 is filled with a dielectric liquid 11 which is substantially chemically inert with respect to the layer structure, and which according to the invention contains non-absorbent particles 12 in a suspended state for scattering the light emitted by the EL layer. Suitable dielectric liquids comprise fluorinated dielectric liquids, for example FC-43 from ³M with a density of 1.88 g/cm³ and a refractive index of 1.29, or Solvay Fomblin with a density of from 1.89 g/cm³ to 1.92 g/cm³ and a refractive index of 1.30. Particles, the density of which differs by less than 5% from the density of the dielectric liquid being used, are in a suspended state in the liquid and thus allow the dielectric liquid with particles to have a scattering behavior independent of position and time.

The layer structure of the EL light source, in particular the organic EL layer, has a refractive index of between 1.6 and 1.9, the refractive index of the dielectric liquid without particles being 1.30. Compared to top emitters with inert gases (n=1.0) in the volume 6, the output is improved here since the optically thinner medium (=dielectric liquid) in the volume 6 has a higher refractive index than an inert gas. By the dielectric liquid with n=1.3, light which sometimes enters the encapsulation device at an angle greater than the angle beyond which total reflection occurs at the subsequent transition of encapsulation device→outside air (n=1.0), is input into the encapsulation device. Output losses therefore occur because of total reflection at the transition of the light from the encapsulation device into the outside air. These losses can be minimized by particles in the dielectric liquid, which scatter the light reflected by the encapsulation device back in the direction of the encapsulation device by means of scattering (or multiple scattering). Minimal output losses are obtained when the refractive index of the dielectric liquid with particles is equal to or greater than the refractive index of the layer structure of the EL light source. In this preferred embodiment, output losses at the interface between the layer structure and the dielectric liquid are eliminated and output losses at the interface with the outside air, or with the encapsulation device, are minimized by means of the scattering effect of the particles. The refractive index of the dielectric liquid can be varied by particles having a diameter in the two-figure nanometer range, depending on the volume proportion of particles in the dielectric liquid and the refractive index of the particles.

The light scattering and, in particular, non-absorbent particles consist of a suitable reflective material or a reflective surface and/or of a suitable material having a refractive index which differs by at least 0.1 from the refractive index of the dielectric liquid. Particle materials particularly suitable for scattering light comprise, for example, metals such as beryllium (density 1.85 g/cm³) or magnesium (density 1.74 g/cm³), alloys, oxide or nitride materials such as unsintered SiN (density 1.82 g/cm³) or ceramics. Particles of at least two materials with different densities, which in a suitable volume ratio to one another form particles having a density equal to the density of the dielectric liquid, make it possible to use optically suitable first and second materials which have a density differing significantly from the dielectric liquid. Suitable materials, for example, comprise metals such as aluminum (density 2.70 g/cm³), metal oxides such as $Al_2O_3$ (density 3.97 g/cm³) or $TiO_2$ (density 4.26 g/cm³) and nonmetal oxides such as $SiO_2$ (density 2.50 g/cm³) which are embedded in plastics, for example PMMA (density 1.20 g/cm³).

A particle of, for example, PMMA and $TiO_2$ having a density of 1.88 g/cm³ accordingly consists of 22.2% $TiO_2$ and 77.8% PMMA. PMMA has a refractive index of 1.49, which is significantly higher than the refractive index of the dielectric liquids such as FC-43 from ³M (1.29) and Solvay Fomblin (1.30). Particularly in combination with $TiO_2$ having a high refractive index of from 2.5 to 2.7, particles of PMMA and $TiO_2$ have a refractive index of greater than 1.5. When very small $TiO_2$ fragments are added to the PMMA, the refractive index of the particle 12 corresponds to the refractive indices of PMMA and $TiO_2$ weighted according to the quantity ratios. If PMMA is replaced by another suitable material for adjusting the density, then other refractive index values are also possible for particles 12. A corresponding structure of the particles 12 is shown in FIG. 3, where fragments of a first material 121 are embedded in a second material 122 and are therefore enclosed by the second material. In this way, the scattering properties of the particle can be set independently of the material ratios required for adjusting a given density. The shape of the particle 12 as represented in FIG. 3 constitutes only an example. Particles 12 may also have other non-spherical shapes. The same applies to the first materials 121 embedded in the second materials 122. Besides the particles shown in FIG. 3, this invention also relates to particles in which the second material 122 is embedded in the first material 121.

FIG. 4 shows an encapsulation device 5 filled with the dielectric liquid 11 according to the invention. Before the encapsulation device is fastened on the layer arrangement, the encapsulation device 5 is in a lying state with the future inside of the encapsulation device (the side of the encapsulation device which, together with the layer structure, delimits the future volume 6) pointing in the upward direction so as to be filled with the dielectric liquid 11. In this position, it is readily possible for the encapsulation device 5 to be filled with the dielectric liquid 11 having the particles 12 contained in it. Before the encapsulation device is filled, the particles 12 are added to the dielectric liquid 11 and distributed homogeneously in the dielectric liquid by a suitable mixing process, for example stirring and/or rotating the liquid in a container. The volume proportion of the particles 12 to the dielectric liquid is between 5% and 60% for optimum light output, depending on the scattering power of the particles and the ratios between the refractive indices of the layer structure, the dielectric liquid and the encapsulation device. It is preferable for the diameter of the particles 12 to be between 10 nm and 2000 nm. The encapsulation device 5 may, for example, be filled with the dielectric liquid by pouring or spraying. For light scattering which is independent of the future spatial arrangement of the electroluminescent light source, it is necessary to fill the volume 6 almost completely with the dielectric liquid. After the encapsulation device 5 has been filled, the layer structure with the substrate is connected to the encapsulation device which is still in a lying position, in order to complete the electroluminescent light source represented in FIG. 2.

In another embodiment, the encapsulation device may also be provided with a sealable opening. In such an embodiment, the encapsulation device in the unfilled state is connected to the layer structure, and the dielectric liquid with particles is subsequently introduced through the opening. After the volume 6 has been filled completely, the opening is closed by suitable means, for example silicone or a seal adhesively bonded over the opening.

It is preferable for the encapsulation device, or the electroluminescent light source, to be filled in a dry atmosphere or in a vacuum.

Particles of a given size can be produced by suitably grinding and subsequently filtering the corresponding starting materials, in particular alloys. Small particles of a first material 121 and a second material 122 can be produced by adding a first material 121 in powder form to a second material 122, for example PMMA, dissolved with a suitable solvent. For example, anisole, chlorobenzene, methylene chloride or acetic acid may be used as solvents. This solution is blown through a nozzle so that the solvent evaporates from the drop-shaped particles which are formed, and the remaining particles 12 are collected. Fragments of the first material 121 coated with the second material 122, for example PMMA, are obtained as a result. The volume ratios between the first material 121 and the second material 122 can be adjusted via the concentration of plastic solution and the quantity of powder material, as well as the size of the powder particles. The size of the resulting particles 12 is determined by the nozzle and the blowing process. As an alternative to dissolving the second material, the powder of a first material 121 may also be added to a melt of a second material 122. The melt is homogenized and blown through a nozzle, which again forms droplet-shaped particles which are collected and optionally cooled. A first material 121 coated with a second material 122, for example PMMA, is likewise obtained as a result.

The embodiments explained with reference to the figures and the description merely represent examples of an electroluminescent light source, and are not to be understood as restricting the patent claims to these examples. Alternative embodiments which are likewise covered by the protective scope of the patent claims are also possible for the person skilled in the art. The numbering of the dependent claims does not imply that other combinations of the claims may not also represent advantageous embodiments of the invention.

The invention claimed is:

1. An electroluminescent light source having a substrate, a layer structure applied on the substrate for emitting light at least on the other side from the substrate, having at least one electrode as an anode, at least one electrode as a cathode and at least one organic electroluminescent layer lying between them, the electrode on the other side from the substrate being at least partially transparent, and an at least partially transparent encapsulation device for forming a closed volume around the layer structure, which is filled with a dielectric liquid that is substantially chemically inert with respect to the layer structure and which contains particles of a non-absorbent material, for scattering light, the density of which is selected so that the particles are in the suspended state in the dielectric liquid, wherein the particles consist of at least one first material having a density greater than the density of the dielectric liquid and at least one second material having a density less than the density of the dielectric liquid.

2. An electroluminescent light source as claimed in claim 1, wherein the first or second material is an organic material.

3. An electroluminescent light source as claimed in claim 2, wherein the first material of the particles is enclosed by the second material of the particles.

4. An electroluminescent light source as claimed in claim 1, wherein the particles have a diameter of between 10 nm and 2000 nm.

5. An electroluminescent light source as claimed in claim 1, wherein the particles have a volume proportion of between 5% and 60% in the dielectric liquid.

6. An electroluminescent light source as claimed in claim 1, wherein the magnitude of the difference between the refractive index of the dielectric liquid and the refractive index of the particles is greater than 0.1.

7. An electroluminescent light source as claimed in claim 6, wherein the refractive index of the particles is greater than 1.5.

8. An electroluminescent light source as claimed in claim 7, wherein the diameter, the refractive index and the volume proportion of the particles in the dielectric liquid are selected so that the refractive index of the dielectric liquid with particles is greater than 1.4.

9. The electroluminescent light source of claim 1, wherein a refractive index of the particles is greater than 2.0.

10. The electroluminescent light source of claim 1, wherein the refractive index and the volume proportion of the particles in the dielectric liquid are selected so that the refractive index of the dielectric liquid with particles is equal to a refractive index of the EL layer structure.

11. A device, comprising:
a substrate;
a electroluminescent light-emitting device disposed on the substrate and having a first side facing the substrate and a second side facing away from the substrate, the electroluminescent light-emitting device emitting light from the second side thereof;
an encapsulation device forming a closed volume around the electroluminescent light-emitting device, the encapsulation device being at least partially transparent so as to transmit at least a portion the light emitted by the electroluminescent light-emitting device;
a liquid disposed within the closed volume; and
particles of a non-light-absorbent material in a suspended state within the liquid, wherein the particles each comprise: at least one first material having a density greater than a density of the liquid; and at least one second material having a density less than the density of the liquid.

12. The device of claim 11, wherein the particles each comprise a reflective material.

13. The device of claim 11, wherein the particles each comprise a reflective surface.

14. The device of claim 11, wherein the particles each comprise a first, reflective, material embedded in a second material, where the second material has a refractive index that is greater than the refractive index of the liquid.

15. The device of claim 11, wherein a refractive index of the liquid having the suspended particles is greater than index of refraction of a material of the electroluminescent light-emitting device that is in contact with the liquid having the suspended particles.

16. The device of claim 11, wherein the particles have a volume proportion of between 5% and 60% in the liquid.

17. The device of claim 11, wherein the particles each comprise at least one first material surrounded by at least one second material different from the first material.

18. The device of claim 11, wherein the magnitude of the difference between the refractive index of the liquid and the refractive index of the particles is greater than 0.1.

* * * * *